United States Patent [19]

Thorne et al.

[11] Patent Number: 5,800,285

[45] Date of Patent: Sep. 1, 1998

[54] METHOD OF FABRICATING GOLF CLUB PARTS CARRYING ARTWORK ETCHED AFTER FABRICATION AND PARTS WITH SUCH ARTWORK

[75] Inventors: John K. Thorne, Prescott, Ariz.; Chester E. Poplaski, Newark, N.Y.

[73] Assignee: Sturm, Ruger & Company, Inc., Southport, Conn.

[21] Appl. No.: 820,562

[22] Filed: Mar. 19, 1997

[51] Int. Cl.⁶ .................................. A63B 53/04
[52] U.S. Cl. .................. 473/324; 473/345; 473/409; 283/74
[58] Field of Search .................. 473/324, 330, 473/331, 345, 409; 359/2; 283/74, 85, 86; 235/457

[56] References Cited

U.S. PATENT DOCUMENTS 3,662,467   5/1972   Schmutzler et al. .
4,214,754   7/1980   Zebelean .
4,809,417   3/1989   Normann .
4,893,840   1/1990   Berkowitz .
5,337,670   8/1994   Huang .................................. 473/324

OTHER PUBLICATIONS

"Golf Digest", magazine, Feb. 1992 issue, p. 167, advertisement for 'Cubic Balance Golf Technology'.

Primary Examiner—Sebastiano Passaniti
Attorney, Agent, or Firm—Pennie & Edmonds LLP

[57] ABSTRACT

A golf club part including a metal component requiring subsequent finishing steps after initial formation which part as photo chemically engraved artwork formed in its surface after completion of the finishing step. The method of fabrication and etching of the metal part includes application of photoresist material to the metal surface, use of graphic art film, masking of surface areas in which artwork will be created by subsequent photochemical engraving, thereafter stripping of the photoresist from the metal surface. Creation of customized patterns on graphic art films is accomplished utilizing a programmable computer.

10 Claims, 3 Drawing Sheets

METHOD OF FABRICATING GOLF CLUB PARTS CARRYING ARTWORK ETCHED AFTER FABRICATION AND PARTS WITH SUCH ARTWORK

BACKGROUND OF THE INVENTION

A prior art technique for creating letters, numbers, symbols, scorelines or other recessed detail in cast golf club heads having flat or curved surfaces has been to cast the recessed detail in the object during the casting operation. Golf club heads have been fabricated by forging, stamping, machining, welding and combinations thereof and have had surface artwork added by mechanical engraving or stamping during or after completion of fabrication.

With respect to the manufacture of cast golf club heads made by casting operations, recessed detail has been formed in the heads during the casting operation. The casting technique has a number of limitations. First, the level of quality that can be obtained in as-cast parts is limited; secondly, the detail that can be obtained is limited; and thirdly, the level of scrap rate cannot be reduced below certain limits. The ability to cast surface artwork and scorelines is also limited in complexity and a high degree of rework may be required to make artwork and scorelines of satisfactory quality.

There is also the disadvantage in forming recessed detail during the casting of golf club heads that subsequent steps of treatment, including hot isostatic pressing and polishing, distort and damage the appearance of the recessed detail. Castings typically have, to some degree, sub-surface micro porosity or "shrink". When the casting is machined or polished, porosity then becomes close to the surface. For golf part castings such surface porosity or "pits" must be repair welded. Such rework welding may be a significant cost in production of the finished product. Hot isostatic pressing eliminates as-cast sub-surface porosity by subjecting the casting to simultaneous high inert gas pressure and elevated temperature, thereby collapsing the sub-surface porosity and diffusion bonding it closed. This technique cannot be used successfully for golf castings having cast-in artwork because the closure of sub-surface porosity typically will damage or distort the surface artwork.

In contrast, in the practice of the present invention, hot isostatic pressing of the as-cast product is feasible because the artwork is applied subsequent to hot isostatic pressing. Therefore, the photo engraving process of this invention enables production of a higher quality product (no sub-surface porosity) and a product that may be made at lower cost (reduced rework welding).

It has also been proposed to print patterns on painted golf club heads (U.S. Pat. No. 5,337,670).

SUMMARY OF THE INVENTION

Broadly, the present invention comprises a golf club part such as head for a wood, iron or putter made at least in part of metal wherein any metal surface is treatable using chemical methods such as by photoengraving to form letters, numbers, symbols or other recessed detail therein (hereinafter referred to as "artwork").

This invention particularly relates to golf club parts of the type that are formed by casting or otherwise fabricating metal, which parts after such casting or fabricating require subsequent processing steps.

This invention includes the method of manufacture of cast or otherwise fabricated golf club heads in which it is desired to form artwork in the surface of the golf club head. Such golf club heads include the crown, face and sole portions. The several portions are, after fabrication, treated to improve their surfaces and shape which treatment includes polishing. Following such treatment the part surfaces which are to receive the artwork are coated with a photoresist. Then graphic art film carrying the desired pattern is applied to accomplish photoengraving recessing. The head part is exposed to light such as incandescent or laser light and after developing such light exposed areas of the resist, the artwork is formed by etching exposed metal surfaces. For positive working photoresist the area under the clear photographic film is exposed to light and after developing such light exposed areas of the resist, the artwork is formed by etching the then exposed metal surfaces. For negative working photoresists, the opposite is true.

The present invention includes fabricating the graphic art film using a computer controlled plotter or other device for placing selected patterns on the graphic art film. By use of programmed computers with storage units a large variety of patterned films can be created. Such films may be applied to planar or non-planar surfaces to in turn create a variety of artwork that can be selectively and economically photoengraved on golf parts.

Product produced by the present invention may have artwork designs and scorelines of greater complexity, sophistication, and in finer detail than available by present manufacturing methods.

DESCRIPTION OF THE PREFERRED EMBODIMENT

Figure 1:
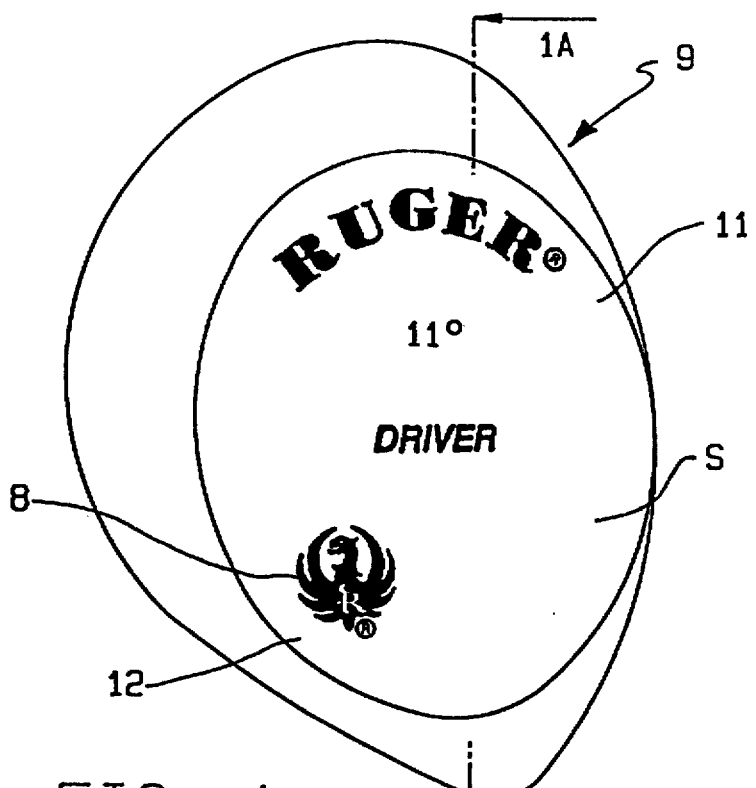
FIG. 1 is a bottom view of a metal wood golf club head showing artwork on its sole plate.
Figure 1A:
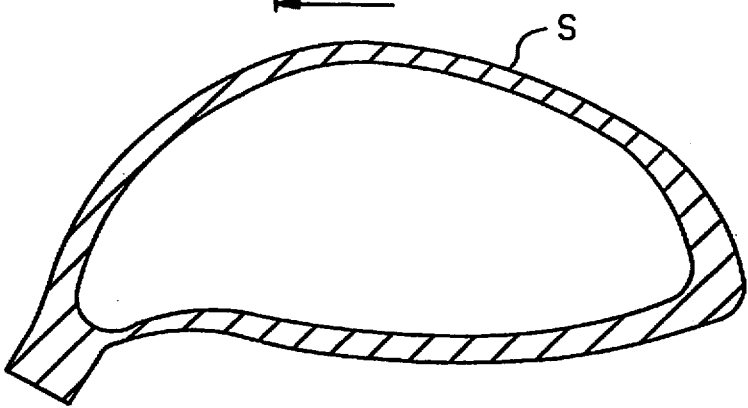
FIG. 1A is a sectional view through line 1A—1A of FIG. 1.
Figure 2:
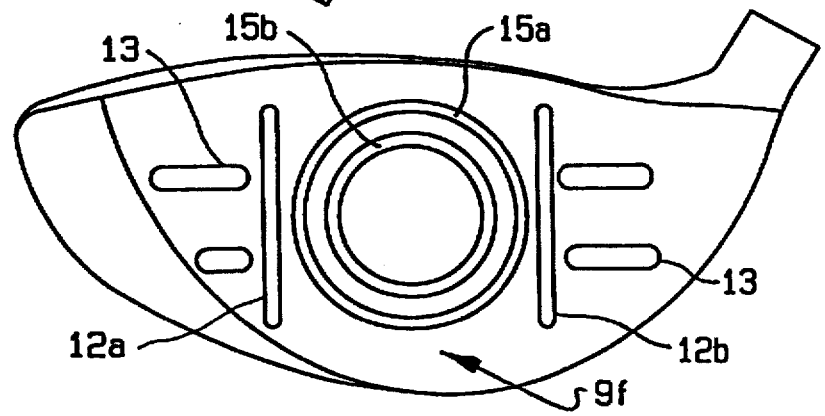
FIG. 2 is a front view of the golf club head of FIG. 1 with lines and concentric circle grooves on the club face.

In FIGS. 1, 1A and 2, artwork is shown on sole plate 11 of golf club head 9 including the trademark "Ruger" and the stylized bird trademark 8 owned by Sturm, Ruger & Co., Inc., assignee of the present patent application. FIG. 1A shows the curvature of the external head surface S and sole plate 11. In FIG. 2, the artwork on club face 9f includes a plurality of horizontal scorelines 13; two (2) vertical scorelines 12a, 12b and two (2) pairs of concentric circles 15a, 15b. Scorelines 13, 12a, 12b and circles 15a, 15b are depressions in club face 9f which function to decorate the head, assist in club-and-ball alignment and to engage the golf ball surface to create golf ball spin. It should be noted artwork may be functional or decorative or both.

Figure 3:
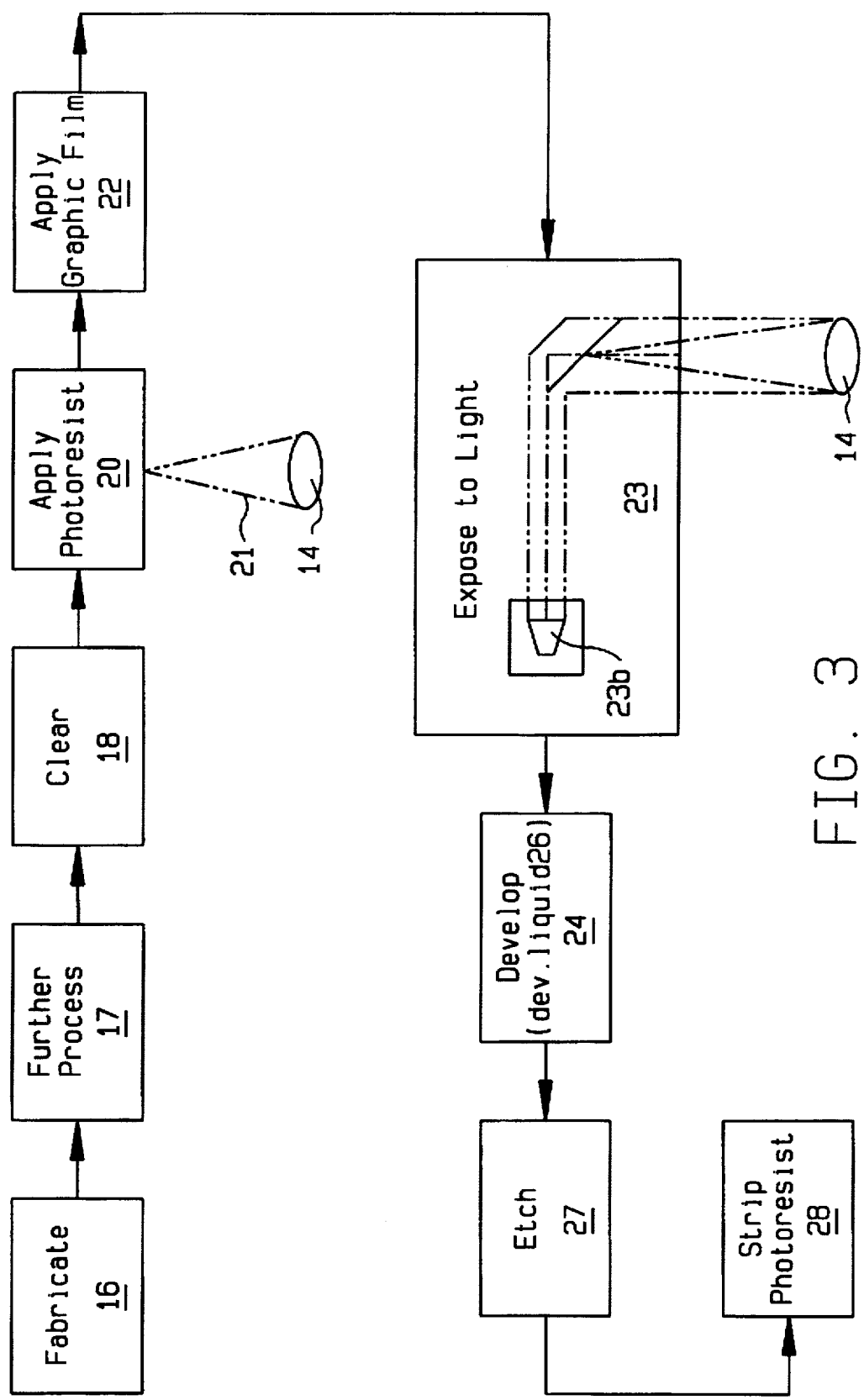
FIG. 3 is a schematic view of steps in the process of photochemical etching of a golf club head surface.

Turning to FIG. 3, the golf head part 14 is first fabricated by casting a shell (which comprises the entire head except the sole plate) and also casting a sole plate. The shell is then welded to a sole plate. Alternatively, golf part head 14 or its parts may be fabricated at station 16 by forging, machining, stamping, welding or other technique or combinations thereof. Part 14 is then further processed including polishing at station 17 and cleaned at station 18. Following cleaning, head part 14 is processed at station 20 by the application of a photoresist material 21 on selected surfaces of part 14 which surfaces are to receive artwork i.e., the sole plate and face surfaces.

Figure 4:
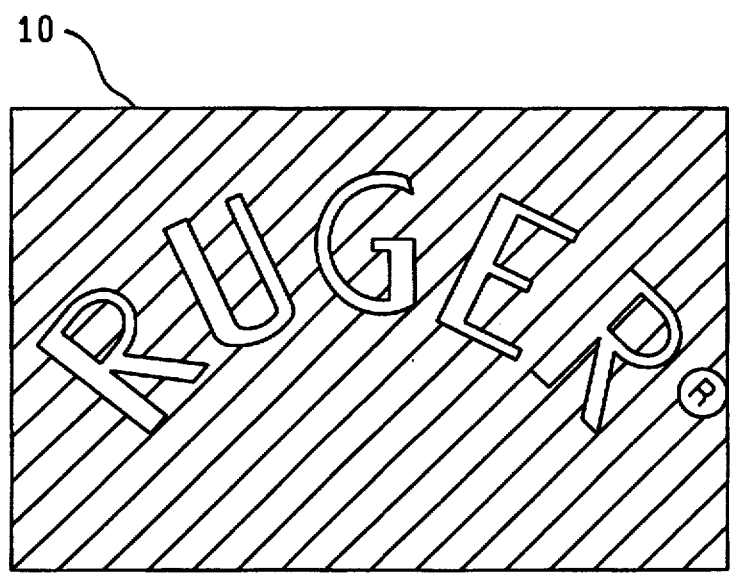
FIG. 4 is a plan view of a graphic art film strip.

The photoresist material 21 is applied as a liquid or as a dry film or both. In the preferred embodiment, photoresist liquid 21 is sprayed on part 14. The next step is applying a piece 10 of graphic art film on the photoresist material 21 which piece 10 includes patterns to form artwork i.e. the mark "Ruger" (see FIG. 4). Film 10 is translucent to allow light to pass through. For positive-working photoresist, film 10 is opaque such that light will not pass through it except for clear areas in which the artwork is defined. The artwork "Ruger" is clear with a solid dark background. Photoresist liquid 21 is a material which is activated (or alternatively not activated) by exposure to light to make such exposed portions soluble to the developing solution which will be subsequently applied. Thus, in the etching of artwork into the sole surface of golf part 14 the sole surface S is coated with photoresist and only the artwork is exposed to light, (i.e., the clear area of the graphic film).

For negative-working photoresist the opposite is true. The graphic film is clear excepting for the artwork which is black. The photoresist liquid 21 is a material which is activated (or alternatively not activated) by exposure to light to make such exposed portions insoluble to the developing solution which will be subsequently applied. For negative-resist, the graphic film has a black artwork area that is subsequently not exposed to light and is removed when exposed to the developing solution.

A light source 23b in station 23 directs light onto part 14. The resist areas which are not exposed to light, including black areas of film 10 remain resistant to the developer to be applied. For positive-working photoresist, the resist areas which are not exposed to light, including black areas of film 10 remain resistant to the developer to be applied. The opposite is true for negative-working resist, i.e., the areas not exposed to light are removed by the developer.

Following exposure to light, head part 14 is conveyed to the develop station 24 to be sprayed with a suitable developer liquid 26. For positive-working resist, the area exposed to light is removed by developer liquid 26. For negative-working resist, the area not exposed to light is removed by developer liquid 26.

Next, head part 14 is subjected to an etching solution at the etch station 27. The etching solution dissolves and erodes the material surface areas not protected by the resist. Etching station 27 is preferably an etching machine having a sump in which the etchant is held at a selected temperature. Etchant is pumped to spray nozzles which etchant is sprayed on the part surfaces. Subsequently, the photoresist is stripped from the surface of the head part 14 at station 28.

Graphic art film carrying letters, symbols, logos or other artwork may be made using a printing or other technique. Where a variety of lettering or other artwork is used in golf club head manufacture, a programmable computer may be used for manufacture of individualized or specialized artwork films.

We claim:

1. A method of making a golf club part comprising the steps of a. initially forming the part having a surface;

b. subsequently treating the formed part; and c. photochemical etching recessed artwork into a surface of the part subsequent to such treatment.

2. A golf club part produced by the method of claim 1.

3. A method of placing artwork on one or more surfaces of a cast golf club head comprising a. casting the golf club head portion except the sole plate;

b. casting the sole plate;

c. attaching the sole plate to the golf club head portion; and d. photo chemically engraving recessed artwork on the so-attached sole plate or other head surfaces.

4. A golf club head produced by the method of claim 3.

5. The method of claim 2 having in addition the step of hot isostatic pressing of said cast head portion prior to the step of photochemically engraving artwork thereon.

6. A golf club part produced by the method of claim 5.

7. The method of claim 1 in which the part surface is non-planar.

8. A golf club part produced by the method of claim 7.

9. A method of fabricating a golf club part comprising the steps of a. initially forming the part with a surface;

b. subsequently treating the formed part;

c. applying a photoresist to the surface of the part;

d. placing a graphic film over the photoresist;

e. exposing the photoresist and the graphic film to light;

f. developing the exposed photoresist on the part surface; and g. etching the part surface not protected by the photoresist to form recessed artwork therein.

10. A golf club part produced by the method of claim 9.

* * * * *